(12) United States Patent
Kim et al.

(10) Patent No.: US 8,723,541 B2
(45) Date of Patent: May 13, 2014

(54) VERTICAL MICRO CONTACT PROBE HAVING VARIABLE STIFFNESS STRUCTURE

(75) Inventors: Jung-Yup Kim, Daejeon (KR); Hak-Joo Lee, Deajeon (KR); Kyung-Shik Kim, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 412 days.

(21) Appl. No.: 12/991,492

(22) PCT Filed: Apr. 30, 2009

(86) PCT No.: PCT/KR2009/002309
§ 371 (c)(1),
(2), (4) Date: Nov. 8, 2010

(87) PCT Pub. No.: WO2009/136707
PCT Pub. Date: Nov. 12, 2009

(65) Prior Publication Data
US 2011/0057675 A1    Mar. 10, 2011

(30) Foreign Application Priority Data
May 8, 2008   (KR) .................. 10-2008-0042931

(51) Int. Cl.
*G01R 1/067*      (2006.01)
(52) U.S. Cl.
CPC ........ *G01R 1/06722* (2013.01); *G01R 1/06711* (2013.01); *G01R 1/06716* (2013.01); *G01R 1/06733* (2013.01)
USPC ............ 324/755.01; 324/755.05; 324/755.04; 324/755.11
(58) Field of Classification Search
CPC ..... F16F 1/3807; F16F 1/3814; F16F 1/3821; F16F 1/403; F16F 1/376; F16F 1/371; F16F 1/13; F16F 1/182; F16F 1/387; F16F 1/025; F16F 1/027; F16F 2230/02; F16F 2234/06; F16F 2236/04; F16F 3/0876; F16F 2230/007; F16F 2224/0241; G01R 1/06716; G01R 1/06711; G01R 1/06722; G01R 1/06733; G01R 1/0675
USPC ........... 324/755.01; 267/70, 71, 87, 142, 144, 267/164, 165
IPC ................ F16F 1/3807, 1/3814, 1/3821, 1/403, F16F 1/376, 1/371, 1/13, 1/182, 1/387, 1/025, F16F 1/027, 2230/02, 2234/06, 2236/04, F16F 3/0876, 2230/007, 2224/0241; G01R 1/06716
See application file for complete search history.

(56) References Cited

U.S. PATENT DOCUMENTS

| | | | | |
|---|---|---|---|---|
| 3,039,221 A  * |  6/1962 | Musgrave | ......................... | 42/50 |
| 7,474,110 B2 * |  1/2009 | Mochizuki et al. | ...... | 324/756.03 |
| 7,556,503 B2 * |  7/2009 | Vinther | ........................... | 439/66 |
| 7,775,804 B2 * |  8/2010 | Neidich et al. | .................. | 439/66 |
| 7,868,642 B2 * |  1/2011 | Naito et al. | ............. | 324/762.02 |
| 2003/0210063 A1* | 11/2003 | Haga et al. | .................... | 324/754 |
| 2005/0110505 A1* |  5/2005 | Tsui et al. | ..................... | 324/754 |
| 2006/0006888 A1* |  1/2006 | Kruglick et al. | .............. | 324/754 |
| 2006/0238209 A1* | 10/2006 | Chen et al. | .................... | 324/754 |
| 2008/0111573 A1* |  5/2008 | Chen et al. | .................... | 324/761 |
| 2008/0190182 A1* |  8/2008 | Lee et al. | ........................ | 73/105 |

FOREIGN PATENT DOCUMENTS

| | | | |
|---|---|---|---|
| JP | 2001-343397 A | | 12/2001 |
| JP | 2002-031648 | | 1/2002 |
| JP | 2003-194847 | | 7/2003 |
| JP | 2004-138405 | | 5/2004 |
| JP | 2006-064676 | | 3/2006 |
| JP | 2006-132982 | | 5/2006 |
| JP | 2007-040743 | | 2/2007 |
| KR | 2008001376 A | * | 1/2008 |
| KR | 10-2008-0108726 | | 12/2008 |

OTHER PUBLICATIONS

International Search Report, issued Dec. 18, 2009, for PCT International Application No. PCT/KR2009/002309.

Japanese Notice of Allowance for Japanese Patent Application No. 2011-508418 dated Nov. 1, 2012.

* cited by examiner

*Primary Examiner* — Huy Q Phan
*Assistant Examiner* — Adam Clarke
(74) *Attorney, Agent, or Firm* — Pearl Cohen Zedek; Latzer Baratz LLP (57) ABSTRACT

An exemplary embodiment of the present invention provides a vertical micro contact probe that includes a column formed by longitudinally continuously stacking a plurality of basic units and a front end formed at the front end of the column and contacting an electrode pad of a semiconductor chip. The basic unit includes a probe body alternately bending to the left and right and protrusions protruding from the probe body at the left and right sides from the center of the width direction, and contacting the adjacent probe body to support the probe body under compression.

14 Claims, 12 Drawing Sheets

VERTICAL MICRO CONTACT PROBE HAVING VARIABLE STIFFNESS STRUCTURE

CROSS-REFERENCE TO RELATED APPLICATIONS

This application is a National Phase Application of PCT International Application No. PCT/KR2009/002309, International Filing Date Apr. 30, 2009, claiming priority of Korean Patent Application, KR 10-2008-0042931, filed May 8, 2008, each incorporated by reference herein in its entirety.

FIELD OF THE INVENTION

The present invention relates to a vertical micro contact probe used for a probe card, and more particularly, to a vertical micro contact probe having a variable stiffness structure.

BACKGROUND ART OF INVENTION

Integration of semiconductor chips has been increased with the development of technologies. In general, complete semiconductor chips undergo electric inspection before packaged, and good products are packaged and bad products are abandoned, in accordance with the inspection result. A probe card that electrically connects a tester equipped with a built-in measurer with the pad of the semiconductor chips is used in the electric inspection.

Figure 1:
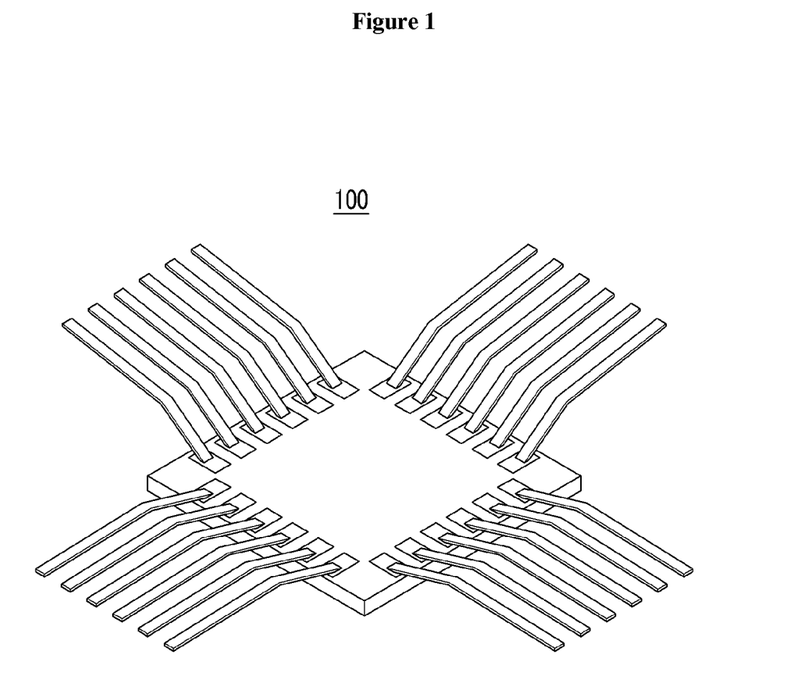
FIG. 1 is a perspective view of a cantilever type micro contact probe according to the related art.

Electric inspection for line of center (LOC) elements of the related art has used a cantilever type probe 100 shown in FIG. 1.

However, C4 (Controlled Collapse Chip Connection) type devices that can improve electric performance and increase integration are recently used in the non-memory field and communication field, the pad arrangement of the C4 devices generally has a non-uniform two-dimensional array and the pad pitch of the semiconductor chips is decreased with the high integration of the semiconductor chips, such that a vertical micro contact probe is required for this reason.

In general, the shape of vertical micro contact probes is limited because these are manufactured by a process for semiconductors, such as electroplating. Further, the probes should have a structure for absorbing vertical displacement to overcome the step between the pads and should generate lateral force to remove native oxide on the electrode surface.

Figure 2:
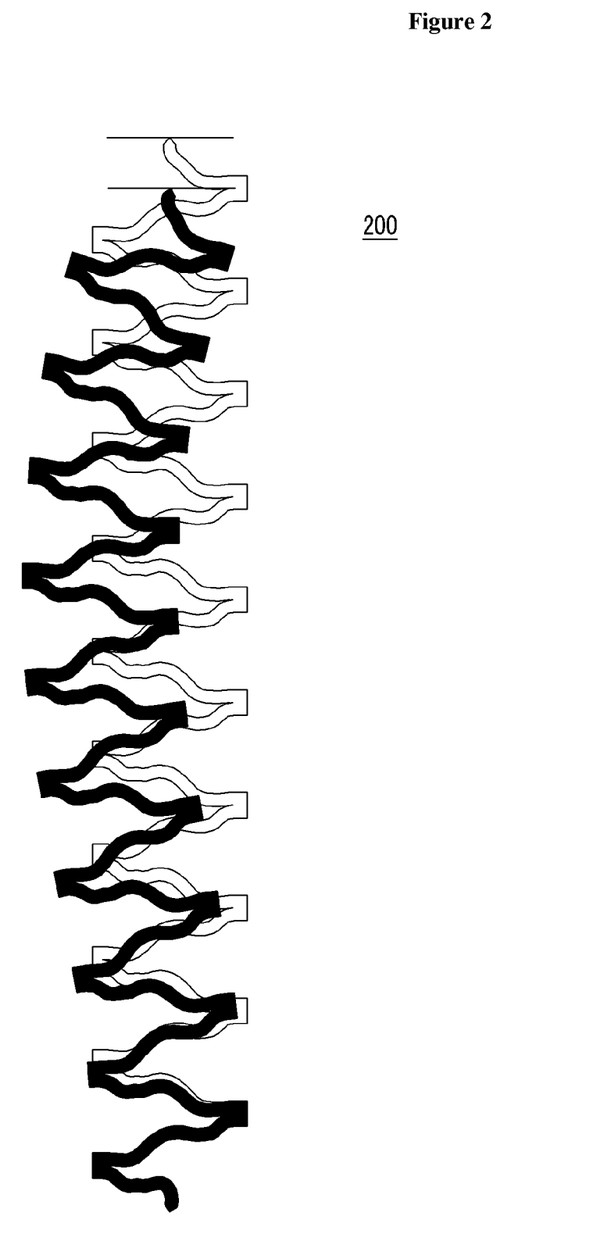
FIG. 2 is a view showing a vertical micro contact probe having a bellows type spring shape according to the related art.

A bellows shape micro contact probe 200 shown in FIG. 2 has been proposed to attenuate stress, under those conditions.

However, in the bellows shape micro contact probe 200 of the related art, buckling or out-of-plane behavior still occurs, and is difficult to be applied when the step between pads is large, while it is difficult to reduce the pitch between the probes.

Further, since a specific guide is used to prevent the buckling in the related art, the manufacturing cost increases and it is difficult to ensure a space between the probes.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a vertical micro contact probe having advantages of reducing the contact area of the tip and preventing out-of-plane behavior by changing the tip shape of the vertical micro contact probe, and varying stiffness and allowing for automatic arrangement by providing the vertical micro contact probe with a stopper.

An exemplary embodiment of the present invention provides a vertical micro contact probe that includes: a column formed by longitudinally continuously stacking a plurality of basic units; and a front end formed at the front end of the column and contacting an electrode pad of a semiconductor chip. The basic unit may includes a probe body alternately bending to the left and right and protrusions protruding from the probe body at the left and right sides from the center of the width direction, and contacting the adjacent probe body to support the probe body under compression.

The gap between the protrusions and the probe body facing the protrusion may be set different at the longitudinal center of the column and at longitudinal both sides of the column.

The gap may increase from the longitudinal center of the column toward the longitudinal both ends of the column.

The gap may increase by a predetermined ratio from the longitudinal center of the column toward the longitudinal both ends of the column.

The gap may increase by a predetermined value by stages from the longitudinal center of the column toward the longitudinal both ends of the column.

The protrusions may be formed at the longitudinal center of the column.

Prominences may further protrude from the probe body facing the protrusions.

The protrusions may be arranged in two lines at the left and right sides from the center of the width direction of the column.

The bending portions of the probe body may be rounded or formed at predetermined angle.

The protrusions may have an elastic structure by protrusion shape.

The protrusion may include an extender extending and bending in parallel with the probe body from the probe body, and a prominence formed at the end of the extender to contact the adjacent probe body under compression.

The length of the extender of the protrusion may decrease from the longitudinal center of the column toward the longitudinal both ends of the column.

The front end may have a plurality of contact portions and has a plurality of contact points between the front end and the semiconductor chip.

According to the exemplary embodiments of the present invention, it is possible to prevent out-of-plane behavior while reducing the contact area of the front end, by changing the shape of the front end of the vertical micro contact probe. As the contact area of the front end is reduced, as described above, contact resistance can be reduced.

Further, according to the exemplary embodiments of the present invention, it is possible to automatically arrange the vertical micro contact probe while changing the stiffness, by providing the probe with a stopper. Since the vertical micro contact probe can be automatically arranged, as described above, a guide for preventing buckling is not needed.

DETAILED DESCRIPTION

Description of Reference Numerals Indicating Primary Elements in the Drawings 10, 20, 30, 40, 50, 60, 70, 80: Micro contact probe
11, 21, 51, 81: Column
12, 52: Front end
13, 53: Basic unit
14, 24, 44, 54: Probe body
15, 25, 35, 45, 55: Protrusion
56: Extender
57: Prominence The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 3:
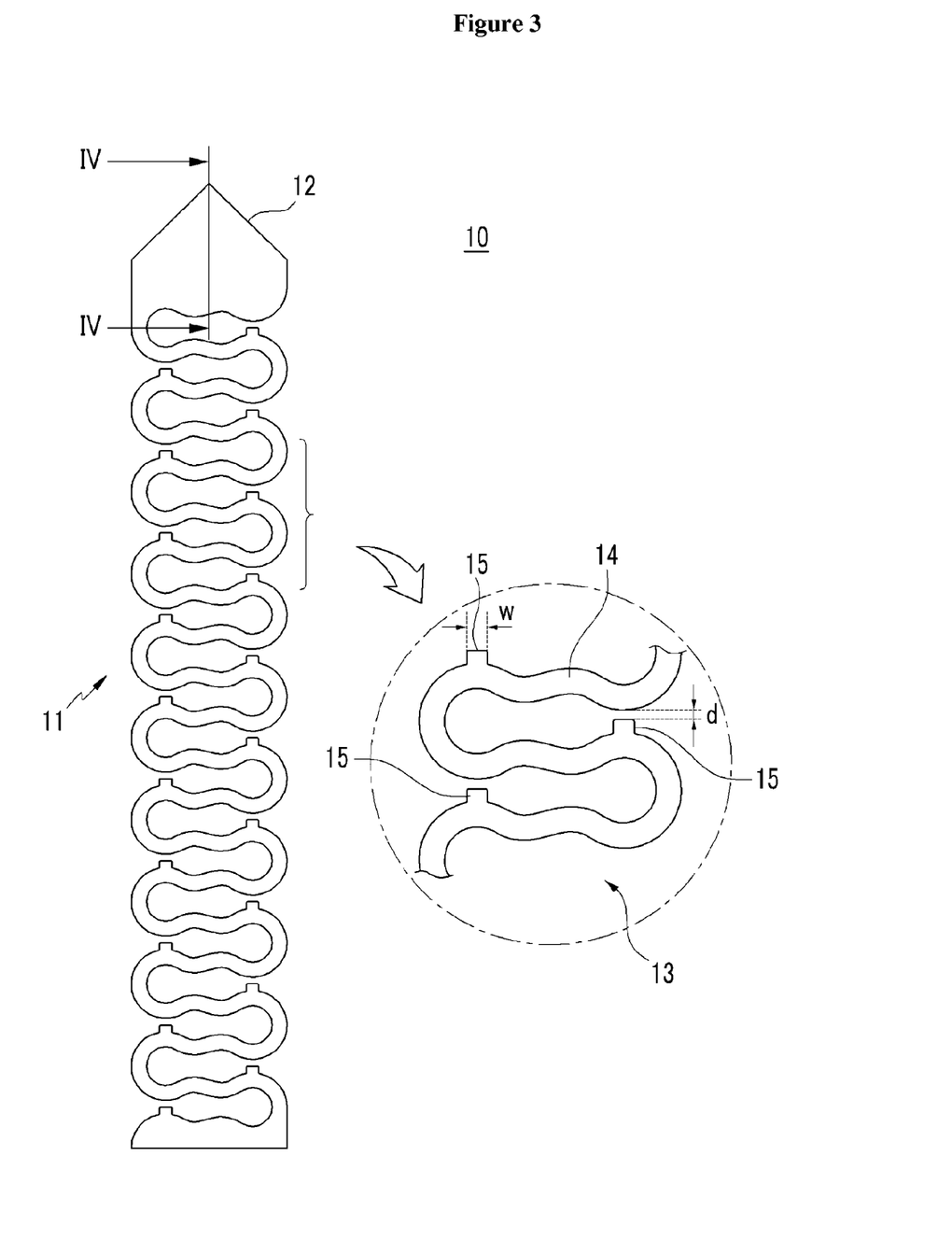
FIG. 3 is a view showing a vertical micro contact probe having a variable stiffness structure according to a first exemplary embodiment of the present invention.
Figure 4:
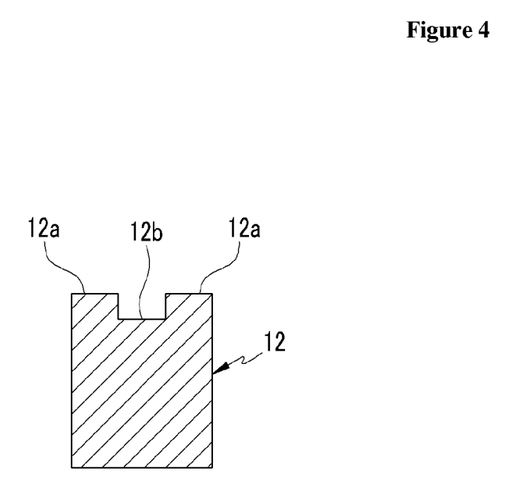
FIG. 4 is a cross-sectional view taken along the line IV-IV of FIG. 3.
Figure 5:
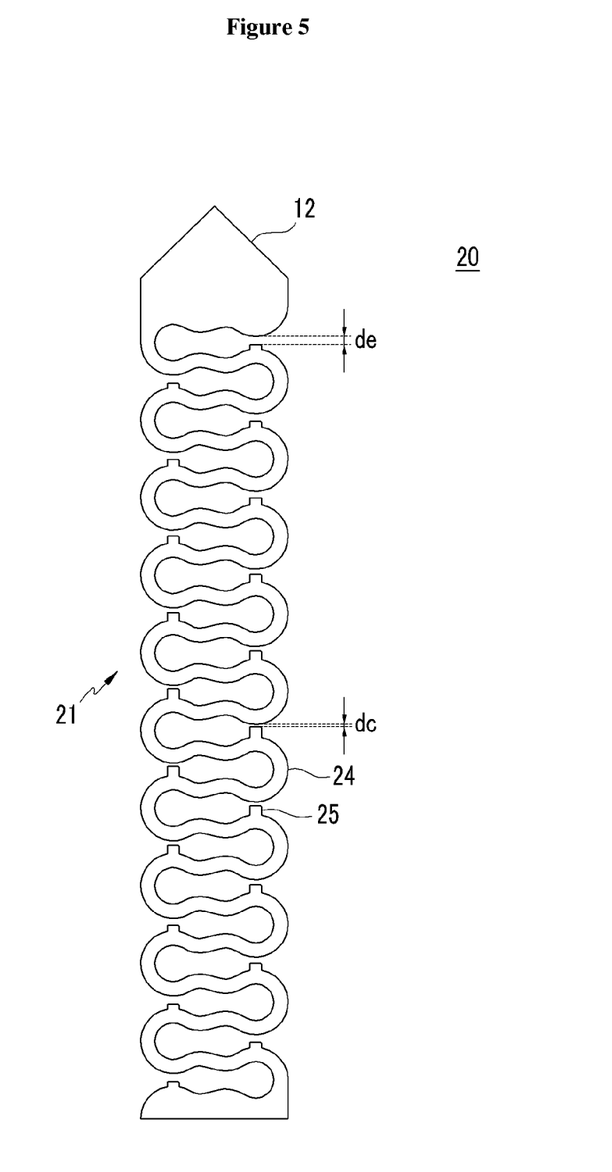
FIG. 5 is a view showing a vertical micro contact probe having a variable stiffness structure according to a first variation of the first exemplary embodiment of the present invention.
Figure 6:
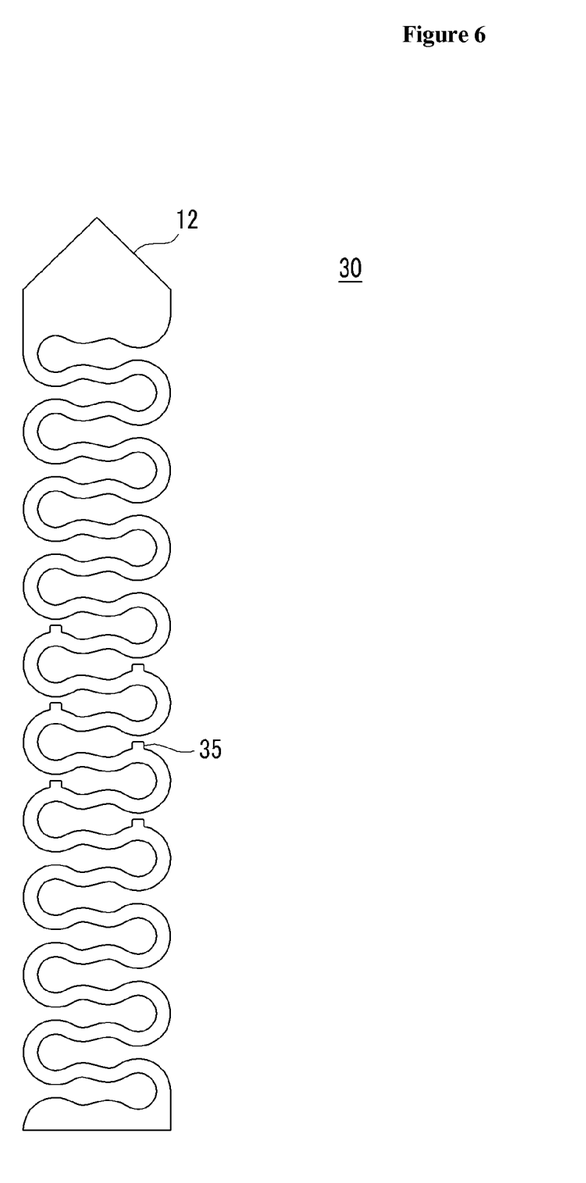
FIG. 6 is a view showing a vertical micro contact probe having a variable stiffness structure according to a second variation of the first exemplary embodiment of the present invention.
Figure 7:
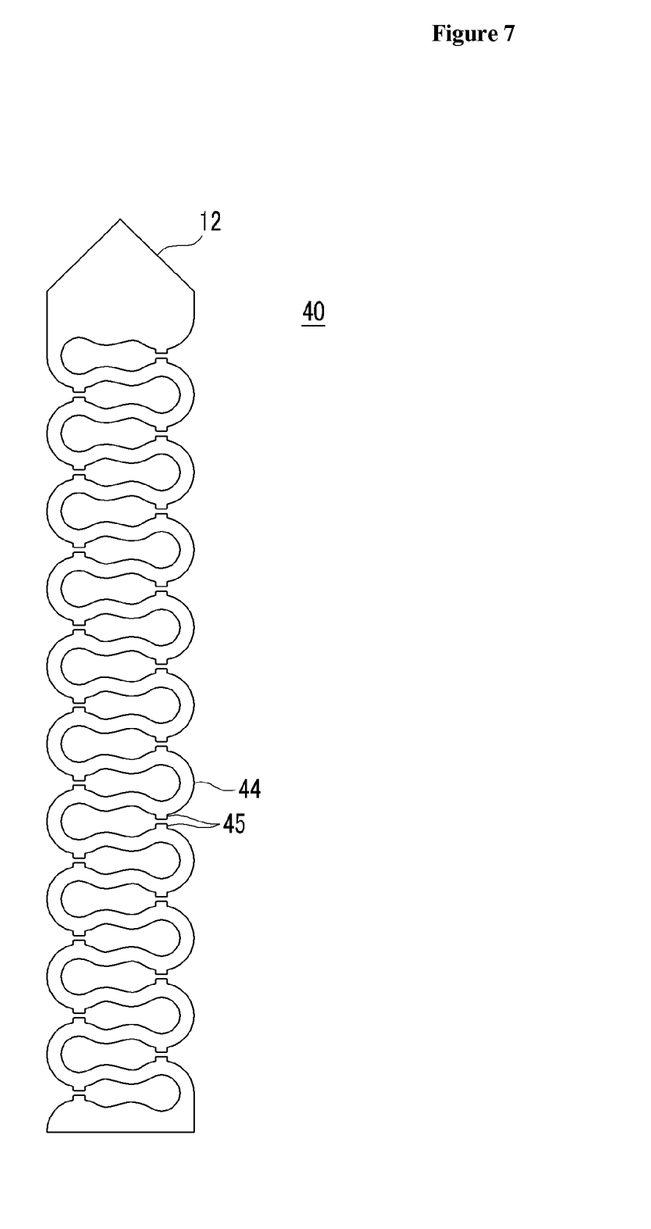
FIG. 7 is a view showing a vertical micro contact probe according to a third variation of the first exemplary embodiment of the present invention.

FIG. 3 is a view showing a vertical micro contact probe having a variable stiffness structure according to a first exemplary embodiment of the present invention and FIG. 4 is a cross-sectional view taken along the line IV-IV of FIG. 3. FIG. 5 to FIG. 7 are views showing vertical micro contact probes having a variable stiffness structure according to the first variation to the third variation of the first exemplary embodiment of the present invention, respectively.

As shown in FIG. 3, a vertical micro contact probe 10 according to the present exemplary embodiment includes a column 11 formed by longitudinally stacking a plurality of basic units 13 and a front end 12 formed at the front end of the column 11 and contacting the electrode pad of a semiconductor chip.

The column 11 is formed by longitudinally (vertically in the figure) and continuously stacking the basic units 13 (see the enlarged view of FIG. 3) in a zigzag shape.

The front end 12 is formed at one end of the column 11, in a substantially triangular shape. The point of the triangular front end 12 contacts the electrode pad of a semiconductor chip, for electric inspection. Obviously, the shape of the front end 12 can be modified in any shape, as long as it can contact the electrode pad of a semiconductor chip, for electric inspection.

As shown in the enlarged view of FIG. 3, one basic unit 13 is alternately bent left and right, and has a probe body 14 with the bending portions rounded and protrusions 15 protruding from the probe body 14 at the left and right sides from the center of the width direction (horizontal in the figure).

The basic units 13 have rounded shapes, which can reduce the maximum stress by distributing the stress concentration points, by increasing the area of the portion where compression stress is applied in compressing the column 11. When the basic unit 13 of the column 11 of the probe has the shape described above, the compression stress is distributed, which is advantageous in strength.

The protrusions 15 defines a gap 'd' from the adjacent probe body 14 in a reference position (not pressed), and contact the adjacent probe body 14 to support the probe body 14 under compression. Therefore, the protrusions 15 are arranged in two lines at the left and right sides of the column 11 and have the above function, such that they can be automatically arranged when the probe 10 is compressed.

Further, the vertical micro contact probe 10 of the present exemplary embodiment has variable stiffness due to the protrusion 15 arranged in two lines. That is, the stiffness of the probe 10 of the present exemplary embodiment is small when the protrusions 15 do not contact the adjacent probe body 14. However, the stiffness of the probe of the present invention increases, when the probe 10 is pressed by external force vertically applied to the probe 10 and the protrusions 15 arranged in two lines contact the adjacent probe bodies 14.

The protrusions 15 shown in FIG. 3 have quadrangular shapes, but the protrusions 15 may be circular, elliptical, or polygonal shapes, other than the quadrangular shapes. When the shape of the protrusion 15 is the quadrangle, surface contact is implemented, but the circular or elliptical shape makes a line contact; therefore, the contact area decreases, such that friction force may decrease and electric resistance may increase, in the circular or elliptical shape.

Further, in the present exemplary embodiment, it is possible to adjust the stiffness of the probe that has been deformed, by changing the width 'w' of the protrusion 15 shown in FIG. 3. As described above, the stiffness of the probe 10 increases when the probe 10 is pressed by vertical external force and the protrusions 15 arranged in two lines contact the adjacent probe bodies 14, when the probe 10 is used.

In this configuration, when the width 'w' of the protrusion 15 is large, the stiffness of the probe that has been compressed is large, whereas when the width 'w' of the protrusion is small, the stiffness of the probe that has been compressed is small. As described above, it is possible to for the designer to adjust the stiffness of the probe that has been deformed, by changing the width 'w' of the protrusion 15 in designing.

As described above, in the vertical micro contact probe of the related art shown in FIG. 2, buckling still occurs, and it is difficult to be applied to a pad having a large step between pads, while it is difficult to reduce the inter-probe pitch.

However, according to the first exemplary embodiment of the present invention, as shown in FIG. 3, since the vertical micro contact probe 10 has the protrusions 15, the protrusions 15 do not contact the up/down adjacent probe bodies 14 at the initial timing when contacting the pad with a step, such that the stiffness of the probe is small. Further, the stiffness of the probe increases, when the probe is in complete contact with the pad to remove the native oxide, because the protrusions 15 are in contact with the up/down adjacent probe bodies 14.

As described above, the vertical micro contact probe 10 according to the exemplary embodiment of the present invention can change the stiffness to be small or large, under the circumstances.

Further, according to the vertical micro contact probe 10 of the present exemplary embodiment, the probe 10 can be automatically arranged (kept vertical) due to the contact of the protrusions 15. Further, as the probe 10 is automatically arranged, it becomes easy to reduce the inter-probe pitch.

In practical use, a plurality of probes is arranged on one probe card. Therefore, there is an inter-probe pitch between one probe and another probe (for reference, the inter-probe pitch implies the distance between adjacent probes on the probe card, and in FIG. 3, a probe pitch means the gap between the protrusions of one probe). When the front end of the probe is out of the axis on the center in the width direction of the probe and the inter-probe pitch is small, mechanical contact with another probe may be caused while the probe is inclined or bent by compression.

According to the vertical micro contact probe 10 of the present exemplary embodiment, since the probe 10 is automatically arranged by the protrusions 15 arranged in two lines, the probe 10 is automatically arranged vertically when the protrusions 15 contact the adjacent probe bodies 14, even if the front end of the head of the probe 10 is out of the axis of the center in the width direction of the probe 10 under compression, such that it is possible to prevent mechanical contact with other probes 10 and reduce the inter-probe pitch.

In the vertical micron contact probe 10 of the present exemplary embodiment, the timing point of the change of stiffness can be freely adjusted by the designer by changing the height of the stopper and the inter-probe pitch.

Meanwhile, the front end 12 formed at one end of the column 11 to perform electrical inspection can be formed in any shape as long as it can contact the electrode pad of a semiconductor chip, for the electrical inspection, but it is preferable to increase the contact pressure by making the contact area between the front end 12 and the electrode pad of the semiconductor chip as small as possible to reduce the contact resistance in the vertical probe 10.

However, out-of-plane behavior easily occurs when the contact area between the electrode pad and the front end 12 decreases. According to the present exemplary embodiment, the front end 12 has two contact portions 12a, as shown in FIG. 4, in order to prevent the out-of-plane behavior while reducing the contact area.

As shown in FIG. 4, a non-contact depression 12b is formed between two contact portions 12a to ensure contact at two points between the electrode pad and the front end 12.

Referring to FIG. 5, in a vertical micro contact probe 20 according to the first variation of the present exemplary embodiment, the gap between a protrusion 25 and a probe body 24 facing the protrusion 25 is determined such that the gap 'dc' at the longitudinal center of the column 21 and the gaps 'de' at both longitudinal sides of the column 21 are different.

In particular, the gap between the protrusion 25 and the probe body 24 facing the protrusion 25 increases from the center of the column 21 toward the upper and lower ends in the present variation. For example, when the gap 'dc' at the center of the column 21 is 1.5 μm, the gap increases by stages, at 1.75 μm, 2 μm, 2.25 μm, 2.5 μm, . . . , toward the upper and lower ends of the column 21.

Alternatively, the gap may be designed to increase at a predetermined ratio (for example, when the ratio of the gap 'dc' at the center of the column 21 and the next gap 'de' toward the upper and lower ends of the column 21 is 1:1.16, the gap can be designed to increases toward the upper and lower ends such that all of the ratios of adjacent gaps becomes 1:1.16). The initial distance, the amount of increase, or the increase ratio does not limit the present invention, and can be changed in designing the probe.

According to the present variation, since the gap between the protrusion 25 and the probe body 14 facing the protrusion 25 is designed to increase toward the upper and lower ends from the center of the column 21, as the probe 20 deforms, the protrusion 25 at the center contacts first the probe body 24 and the protrusions 25 sequentially contact the probe bodies, toward the upper and lower ends.

Therefore, it is possible to restrict behavior of the probe body 14 at the center first even in buckling, such that it is possible to effectively prevent buckling more than when the protrusions 25 are formed at regular distances.

Further, when the protrusion 25 contacts the probe body at the center, the probe does not deform any more and the other portions at the upper and lower portions deform, such that the entire length of the probe is reduced. Accordingly, the stiffness increases, thereby easily achieving large load.

Further, although the protrusions 15 are formed at the probe bodies 14 of all of the basic units from the center to the upper and lower ends in FIG. 3, as shown in FIG. 6, protrusions 35 may be formed at the basic units at the center portion where buckling is large, not at all of the basic units over the entire length of the probe 30, if needed.

Further, as shown in FIG. 7, protrusions 45 may protrude downward or upward and downward to face each other from the probe body 44 of the basic unit, other than when they protrude upward from the probe body 44. When the protrusions 45 are formed to face each other, the contact area can be adjusted and free design is possible.

Figure 8:
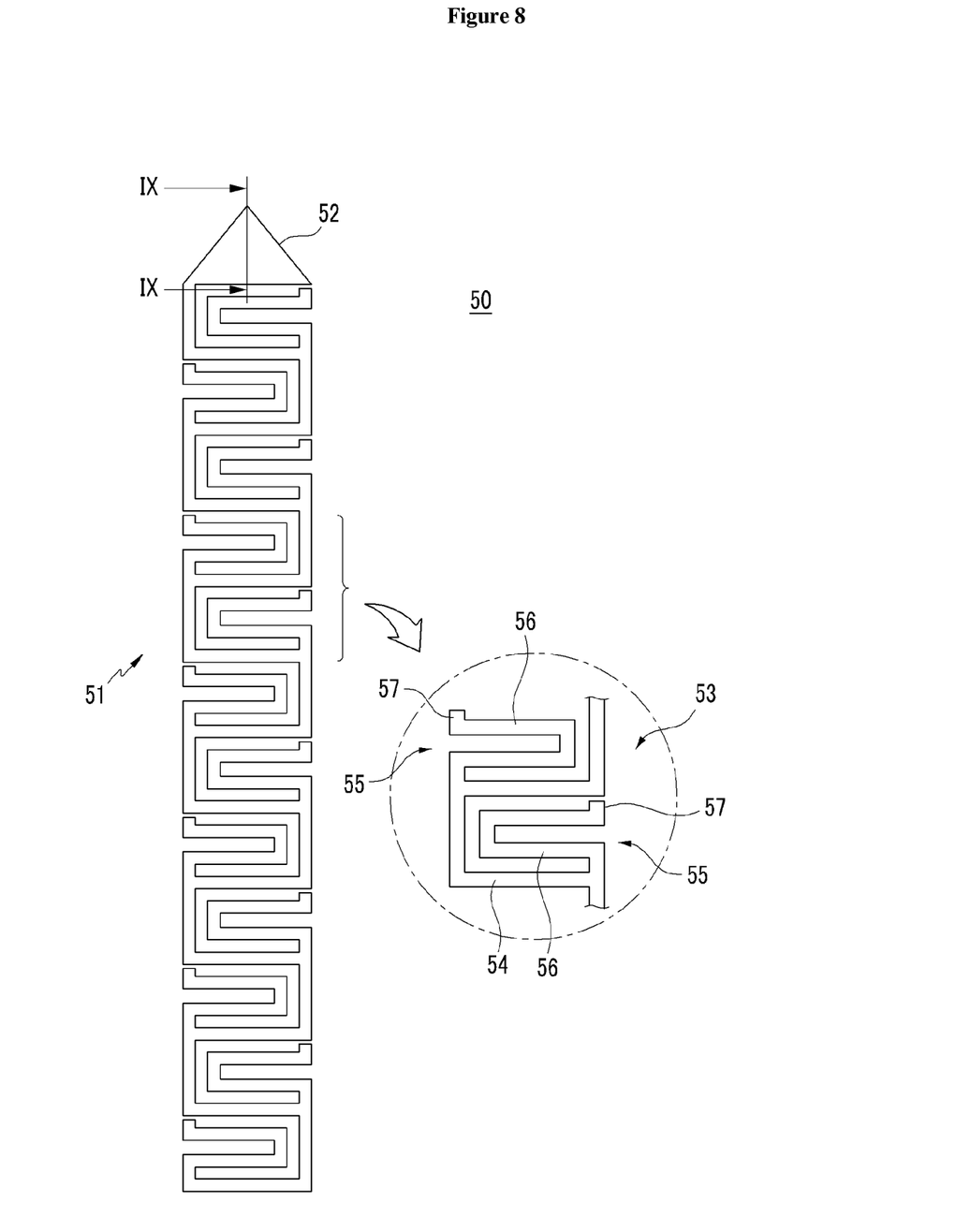
FIG. 8 is a view showing a vertical micro contact probe having a variable stiffness structure according to a second exemplary embodiment of the present invention.
Figure 9:
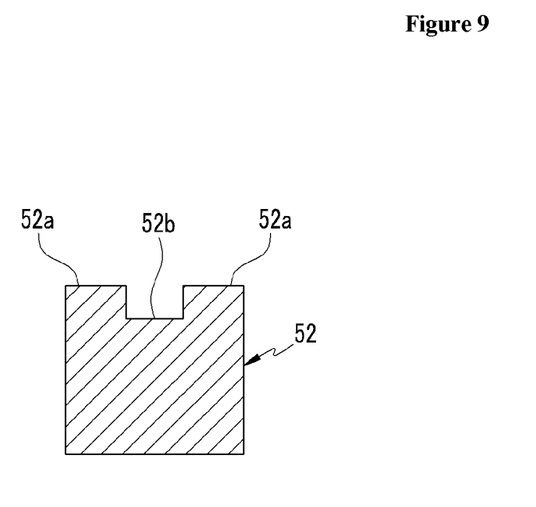
FIG. 9 is a cross-sectional view taken along the line IX-IX of FIG. 8.
Figure 10:
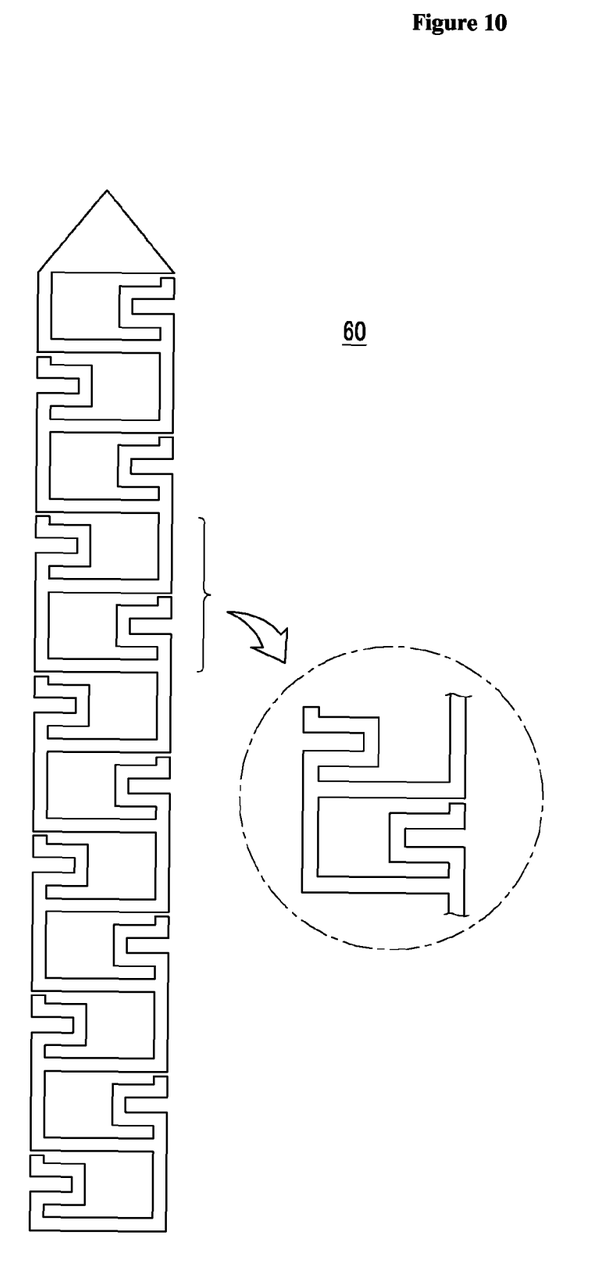
FIG. 10 is a view showing a vertical micro contact probe according to a first variation of the second exemplary embodiment of the present invention.
Figure 11:
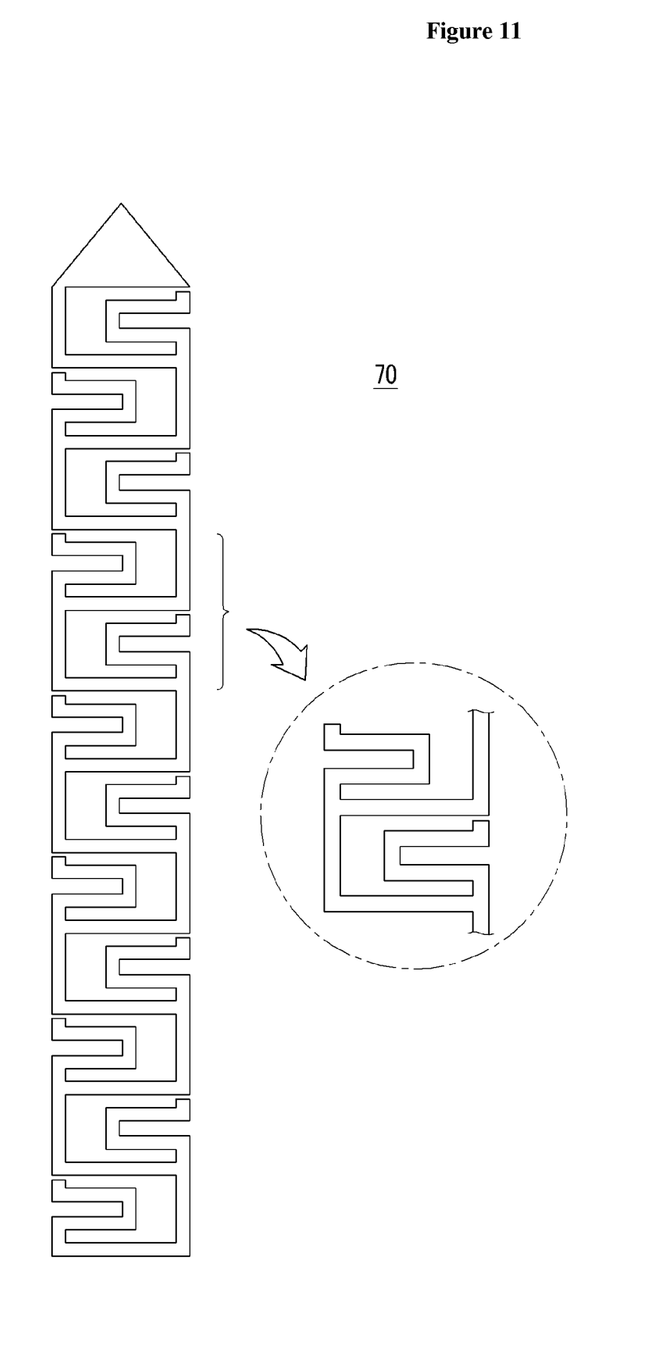
FIG. 11 is a view showing a vertical micro contact probe according to a second variation of the second exemplary embodiment of the present invention.
Figure 12:
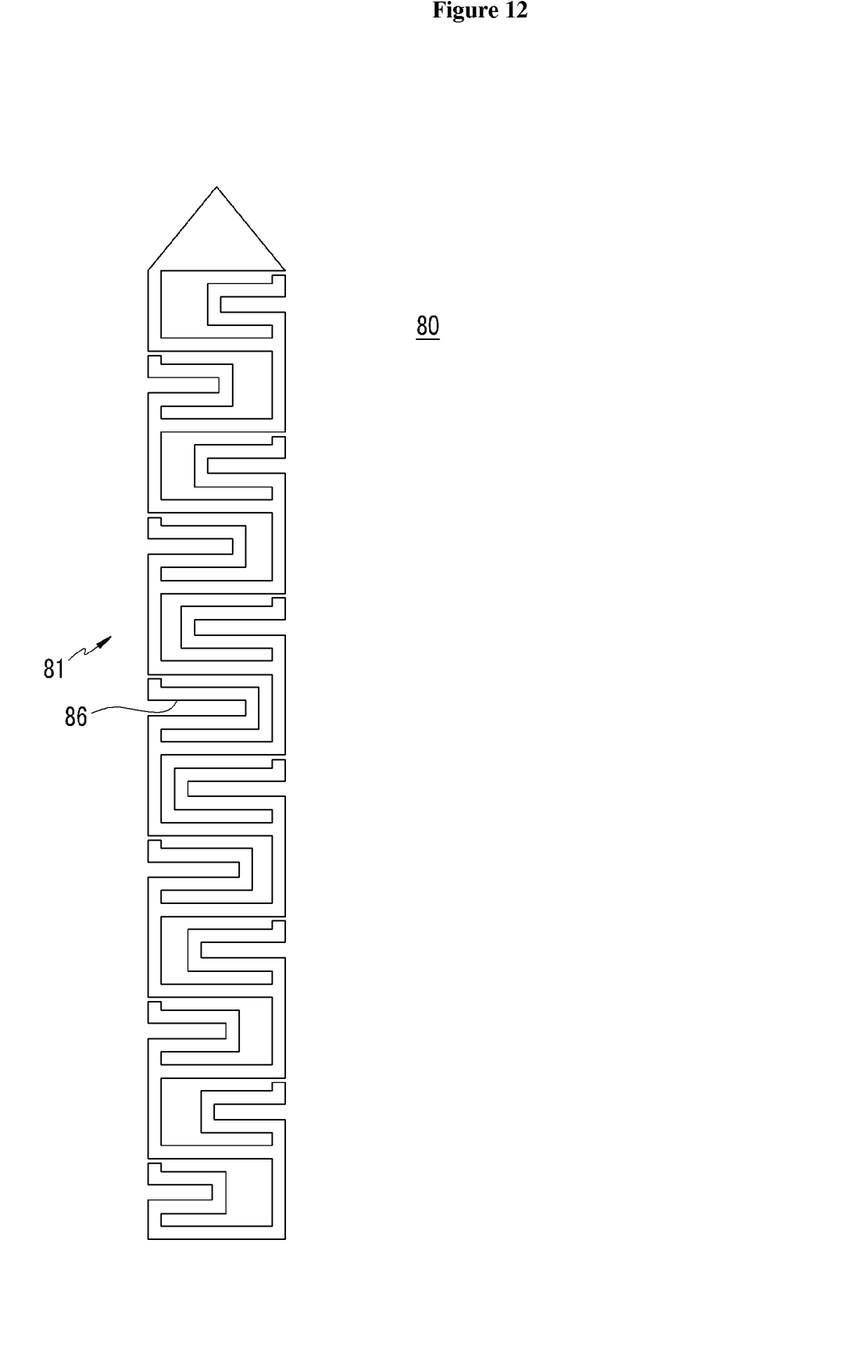
FIG. 12 is a view showing a vertical micro contact probe according to a third variation of the second exemplary embodiment of the present invention.

FIG. 8 is a view showing a vertical micro contact probe having a variable stiffness structure according to a second exemplary embodiment of the present invention and FIG. 9 is a cross-sectional view taken along the line IX-IX of FIG. 8. FIG. 10 to FIG. 12 are views showing vertical micro contact probes according to the first variation to the third variation of the second exemplary embodiment of the present invention, respectively.

As shown in FIG. 8, a vertical micro contact probe 50 according to the second exemplary embodiment of the present invention, as in the first exemplary embodiment described above, includes a column 51 formed by longitudinally continuously stacking a plurality of basic units 53 and a front end 52 formed at the front end of the column 51 and contacting the electrode pad of a semiconductor chip.

The column 51 is formed by stacking the basic units 53 in a serpentine shape (see the enlarged view of FIG. 8).

The front end 52 is formed at one end of the column 51, in a substantially triangular shape. The point of the triangular front end 52 contacts the electrode pad of a semiconductor chip, for electric inspection. Obviously, the shape of the front end 12 does not limit the present invention and can be modified in any shape, as long as it can contact the electrode pad of a semiconductor chip, for electric inspection.

As shown in the enlarged view of FIG. 8, one basic unit 53 includes a probe body 54 bending at a predetermined angle and protrusions 55 contacting the adjacent probe body 54 to support the probe body 54 under compression.

Further, in the second exemplary embodiment, the protrusions 55 may have the elastic structure by protrusion shape.

As shown in FIG. 8, the protrusions 55 protruding from the probe bodies 54 each include an extender 56 that extends from the probe body 54 and elastically deforms by means of pressure, and a prominence 57 formed at the end of the extender 56 and contacting the adjacent probe body 54 under compression.

Since the protrusions 55 of the present exemplary embodiment have the elastic structure by protrusion shape, it is possible to reduce the sudden increase of stiffness right after the protrusions 55 contact the adjacent probe bodies 54, as compared with the protrusions not having the elastic structure by protrusion shape in the first exemplary embodiment. Therefore, the protrusions 55 having the elastic structure by protrusion shape in the second exemplary embodiment has the advantage of being not limited in use.

Since the magnitude of elasticity of the protrusions 55, that is, the stiffness can be changed under compression in accordance with the width and height of the extenders 56, according to the second exemplary embodiment of the present invention, it is possible to change the dimension of the extenders 56 included in the protrusions 55 in accordance with stiffness required in designing the probe 50.

FIG. 10 and FIG. 11 show probes with the dimension of the extender 56 changed according to various variations. The vertical micro contact probes 60 and 70 shown in FIG. 10 and FIG. 11 are implemented by changing only the dimension of the extender 56 shown in FIG. 8, such that the detailed description is not provided.

Further, though not shown in the figures, the shape of the extender 56 may be, for example, a circle, an ellipsis, a triangle, or other polygons, other than the shape bending two times shown in FIGS. 8 to 11.

As shown in FIG. 8, the vertical micro contact probe 50 according to the second exemplary embodiment, as in the first exemplary embodiment, also can be automatically arranged under compression, with the protrusions 55 arranged in two lines at the left and right sides of the column 51. Further, the stiffness of the vertical micro contact probe 50 of the present exemplary embodiment is variable by the protrusions 55 arranged in two lines.

That is, the stiffness of the probe 50 of the present exemplary embodiment is small, when the protrusions 55 do not contact the adjacent probe bodies 54. However, the stiffness of the probe of the present invention increases, when the probe 50 is pressed by external force longitudinally applied to the probe 50 and the protrusions 55 arranged in two lines contact the adjacent probe bodies 54.

Meanwhile, the vertical micro contact probe 50 of the second exemplary embodiment can be designed such that the gap between the prominence 57 included in the protrusion 55 and the probe body 54 adjacent to the prominence 57 increases by a predetermined value or at a predetermined ratio toward both ends from the longitudinal center of the column 51, as in the first variation of the first exemplary embodiment.

Further, in the vertical micro contact probe 50 of the second exemplary embodiment, the size and shape of the prominence 57 may be determined to correspond to the size and shape of the protrusion 55 in the first exemplary embodiment.

Further, in the vertical micro contact probe 50 according to the second exemplary embodiment, as in the vertical micron contact probe 50 according to the first exemplary embodiment described above, the front end 52 has two contact portions 52a, as shown in FIG. 9, in order to prevent out-of-plane behavior while reducing the contact area between the electrode pad and the front end 52.

FIG. 9 is a cross-sectional view taken along the line IX-IX of FIG. 8. As shown in FIG. 9, a non-contact depression 52b is formed between two contact portions 52a to ensure contact at two points between the electrode pad and the front end 52.

Further, although all of the protrusions 55 has the extenders 56 having the same width and height from the center to the upper and lower ends in FIG. 8, as shown in FIG. 12, the width and the height of the extenders 86 of one probe 80 may be different, if needed. For example, the width and the height of the extenders 86 may be gradually decreased toward both ends from the longitudinal center of the probe column 81.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A vertical micro contact probe for electric inspection of a semiconductor chip, comprising:
 a column formed by longitudinally continuously stacking a plurality of basic units; and
 a front end formed at the front end of the column and contacting an electrode pad of a semiconductor chip,
 wherein the basic unit includes:
  a probe body alternately bending to the left and right; and
  protrusions protruding from the probe body and having quadrangular shapes, the protrusions being arranged in two lines at the left and right sides from the center of the width direction, and contacting an adjacent probe body to support the probe body under compression thereby automatically keeping the probe body vertical while suppressing buckling due to the contact of the protrusions.

2. The vertical micro contact probe of claim 1, wherein:
 the gap between the protrusions and the probe body facing the protrusion is set differently at the longitudinal center of the column and at longitudinal both sides of the column.

3. The vertical micro contact probe of claim 2, wherein:
 the gap increases from the longitudinal center of the column toward the longitudinal both ends of the column.

4. The vertical micro contact probe of claim 2, wherein:
 the gap increases by stages by a predetermined ratio from the longitudinal center of the column toward the longitudinal both ends of the column.

5. The vertical micro contact probe of claim 2, wherein:
 the gap increases by a predetermined value by stages from the longitudinal center of the column toward the longitudinal both ends of the column.

6. The vertical micro contact probe of claim 1, wherein:
 the protrusions are formed at the longitudinal center of the column.

7. The vertical micro contact probe of claim 1, wherein:
 prominences further protrude from the probe body facing the protrusions.

8. The vertical micro contact probe of claim 1, wherein:
 the bending portions of the probe body are rounded.

9. The vertical micro contact probe of claim 1, wherein:
 the bending portions of the probe body are formed at predetermined angle.

10. The vertical micro contact probe of claim 1, wherein:
 the front end has a plurality of contact portions and has a plurality of contact points between the front end and the semiconductor chip.

11. A vertical micron contact probe for electric inspection of a semiconductor chip, comprising:

a column formed by longitudinally continuously stacking a plurality of basic units; and a front end formed at the front end of the column and contacting an electrode pad of a semiconductor chip, wherein the basic unit includes:

a probe body alternately bending to the left and right; and protrusions protruding from the probe body and having quadrangular shapes, the protrusions being arranged in two lines at the left and right sides from the center of the width direction, and contacting the adjacent probe body to support the probe body under compression thereby automatically keeping the probe body vertical while suppressing buckling due to the contact of the protrusions;

wherein the protrusions have an elastic structure by protrusion shape and comprise an extender extending and bending from the probe body, and a prominence formed at the end of the extender to contact the adjacent probe body under compression.

12. The vertical micro contact probe of claim 11, wherein:
the shape of the extender is a circle, an ellipsis, a triangle, other polygons or the shape bending in parallel with the probe body two times.

13. The vertical micro contact probe of claim 12, wherein:
the length of the extender of the protrusion decreases from the longitudinal center of the column toward the longitudinal both ends of the column.

14. The vertical micro contact probe of claim 12, wherein:
the gap between the prominence of the protrusion and the probe body facing the prominence is different at the longitudinal center of the column and at the longitudinal both ends of the column.

* * * * *